US008164371B2

United States Patent
Monma

(10) Patent No.: US 8,164,371 B2
(45) Date of Patent: Apr. 24, 2012

(54) DUTY DETECTION CIRCUIT, CLOCK GENERATION CIRCUIT INCLUDING THE DUTY DETECTION CIRCUIT, AND SEMICONDUCTOR DEVICE

(75) Inventor: Atsuko Monma, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 225 days.

(21) Appl. No.: 12/659,551

(22) Filed: Mar. 12, 2010

(65) Prior Publication Data

US 2010/0237917 A1    Sep. 23, 2010

(30) Foreign Application Priority Data

Mar. 19, 2009    (JP) .............................. 2009-068028

(51) Int. Cl.
*H03L 7/06* (2006.01)
(52) U.S. Cl. ....................................... 327/158; 327/149
(58) Field of Classification Search .................. 327/149, 327/158
See application file for complete search history.

(56) References Cited

U.S. PATENT DOCUMENTS

| 7,411,435 | B2 | 8/2008 | Monma et al. |
| 7,642,829 | B2 | 1/2010 | Monma et al. |
| 8,004,336 | B2 * | 8/2011 | Yoon et al. ................... 327/233 |
| 2004/0042368 | A1 * | 3/2004 | Kwag et al. ............... 369/59.17 |
| 2007/0146028 | A1 * | 6/2007 | Lee ............................... 327/161 |
| 2008/0122513 | A1 * | 5/2008 | Ong et al. ...................... 327/263 |
| 2009/0146700 | A1 * | 6/2009 | Kim et al. ..................... 327/144 |
| 2009/0168552 | A1 * | 7/2009 | Yoon et al. ................ 365/189.07 |
| 2009/0206900 | A1 * | 8/2009 | Song et al. ..................... 327/175 |
| 2010/0073057 | A1 * | 3/2010 | Ku ................................. 327/175 |
| 2010/0073059 | A1 * | 3/2010 | Chae et al. .................... 327/175 |
| 2010/0237917 | A1 * | 9/2010 | Monma ......................... 327/158 |
| 2010/0321076 | A1 * | 12/2010 | Bae et al. ...................... 327/158 |
| 2011/0080104 | A1 * | 4/2011 | Gray et al. ..................... 315/246 |
| 2011/0267124 | A1 * | 11/2011 | Kim et al. ..................... 327/175 |
| 2011/0298513 | A1 * | 12/2011 | Na et al. ....................... 327/175 |

FOREIGN PATENT DOCUMENTS

JP    2006-217223    8/2006

* cited by examiner

*Primary Examiner* — Lincoln Donovan
*Assistant Examiner* — Adam Houston
(74) *Attorney, Agent, or Firm* — McGinn IP Law Group PLLC

(57) ABSTRACT

To provide a duty detection circuit including: a plurality of duty detectors that detect a duty ratio of internal clocks; a controller that controls the plurality of duty detectors so that the plurality of duty detectors operates in different phases from one another; and an output selecting unit that selects one of duty detection signals from the plurality of duty detectors. According to the present invention, since the duty detectors operate in the different phases from one another, the output selecting unit can output a duty detection signal with a higher frequency than a generation frequency with which each duty detector generates the duty detection signal. Accordingly, when the duty detection circuit according to the present invention is used to adjust a clock of the DLL circuit, a control period of the DLL circuit can be reduced.

20 Claims, 12 Drawing Sheets

DUTY DETECTION CIRCUIT, CLOCK GENERATION CIRCUIT INCLUDING THE DUTY DETECTION CIRCUIT, AND SEMICONDUCTOR DEVICE

BACKGROUND OF THE INVENTION

1. Field of the Invention

The present invention relates to a duty detection circuit capable of generating a duty detection signal with high frequency, and a clock generation circuit including the same. The present invention also relates to a semiconductor device including the clock generation circuit.

2. Description of Related Art

In recent years, a synchronous memory that operates synchronously with a clock has been widely used as a main memory of personal computers or the like. Particularly in a DDR (Double Date Rate) synchronous memory, it is necessary to accurately synchronize input/output data with an external clock. Therefore, a DLL (Delay Locked Loop) circuit that generates an internal clock synchronous with the external clock is employed.

A DLL circuit of a certain type adjusts a rising edge of an internal clock based on a result of phase comparison, and adjusts a falling edge of the internal clock based on a result of duty detection. According to this method, it is possible to generate an internal clock coincident with an external clock in phase, and to adjust a duty ratio of the internal clock to approximately 50% even when a duty ratio of the external clock is offset from 50%.

To detect the duty ratio of the internal clock, a duty detection circuit is used (see Japanese Patent Application. Laid-open No. 2006-217223). The duty detection circuit includes an integral capacitor into or from which electricity is charged or discharged synchronously with an internal clock, and determines a duty ratio of the internal clock based on a voltage of the integral capacitor. Accordingly, to perform a duty detection operation, it is necessary to perform charging and discharging operations over cycles that are integral multiples of the internal clock. Besides, it is necessary to perform an operation for determining a voltage of an integral capacitor and a latch operation for a determination result. Accordingly, a plurality of cycles are required for a series of operations.

By way of example, when two cycles are necessary for charging and discharging operations, one cycle is necessary for determining the voltage of the integral capacitor, and one cycle is necessary for the latch operation for the determination result, four cycles are necessary in all to complete a series of operations. That is, in this case, an update frequency of the duty detection signal is limited to four cycles and the duty detection signal cannot be updated in shorter cycles than the four cycles.

Nevertheless, there has been a demand of updating duty detection signals more frequently.

For example, in a case of a DLL circuit of a type to adjust the rising edge of the internal clock based on the result of the phase comparison, and to adjust the falling edge of the internal clock based on the result of the duty detection as described above, it is necessary to perform the duty detection operation after adjusting the rising edge of the internal clock. When it is necessary to use, for example, eight cycles to adjust the rising edge of the internal clock, a control period of the DLL circuit is 12 cycles at the shortest as long as the generation frequency of generating the duty detection signal is four cycles.

Furthermore, when nine cycles are necessary to adjust the rising edge of the internal clock, then a correct duty detection signal cannot be obtained promptly in the ninth cycle, and it is the 12th cycle when the duty detection signal is updated next to the eighth cycle. Therefore, the control period of the DLL circuit is 16 cycles and the control period is considerably increased.

Moreover, when jitter is to be suppressed by using duty detection signals obtained over a plurality of periods, it disadvantageously takes a very long time for determination. For example, when a duty adjustment direction is determined based on the five duty detection signals and the generation frequency of the duty detection signal is four cycles, it takes 20 cycles of time to make the duty determination alone.

SUMMARY

In one embodiment, there is provided a duty detection circuit that includes: a plurality of duty detectors that detect a duty ratio of an internal clock; a controller that controls the duty detectors so that the duty detectors operate in different phases from one another; and an output selecting unit that selects one of duty detection signals output from the duty detectors.

In another embodiment, there is provided a clock generation circuit that includes: the above-described duty detection circuit; a DLL circuit that controls a phase of the internal clock; and first and second replica buffers, wherein the internal clock includes first and second internal clocks different in phase, the DLL circuit includes: a first delay line that generates a third internal clock by delaying a first external clock; a second delay line that generates a fourth internal clock by delaying a second external clock; a first phase comparison circuit that determines a phase of the first external clock and a phase of the first internal clock; a first delay control circuit that controls a delay amount of the first delay line based on a determination result of the first phase comparison circuit; and a second delay control circuit that controls a delay amount of the second delay line based on at least the duty detection signal, and wherein the first replica buffer generates the first internal clock in response to the third internal clock, and the second replica buffer generates the second internal clock in response to the fourth internal clock.

In still another embodiment, there is provided a semiconductor device that includes: the above-described clock generation circuit; an internal circuit that generates output data; and an output buffer that outputs the output data to outside synchronously with the third and fourth internal clocks, wherein the first and second replica buffers each have an impedance equal to an impedance of the output buffer.

According to the present invention, the plurality of duty detectors operate in different phases. Therefore, the output selecting unit can output a duty detection signal with a higher frequency than a frequency with which each duty detector generates the duty detection signal. Accordingly, when the duty detection circuit according to the present invention is used to adjust clocks of the DLL circuit, a control period of the DLL circuit can be reduced. Further, even when it is necessary to suppress jitter by using duty detection signals obtained over a plurality of times, the time for determination is not considerably increased.

Accordingly, when the present invention is applied to a semiconductor device such as a DDR synchronous memory, it is possible to adjust a phase of output data with high accuracy even when a power supply voltage and environmental temperature change.

BRIEF DESCRIPTION OF THE DRAWINGS

The above features and advantages of the present invention will be more apparent from the following description of certain preferred embodiments taken in conjunction with the accompanying drawings, in which.

DETAILED DESCRIPTION OF THE EMBODIMENTS

Preferred embodiments of the present invention will be explained below in detail with reference to the accompanying drawings.

Figure 1:
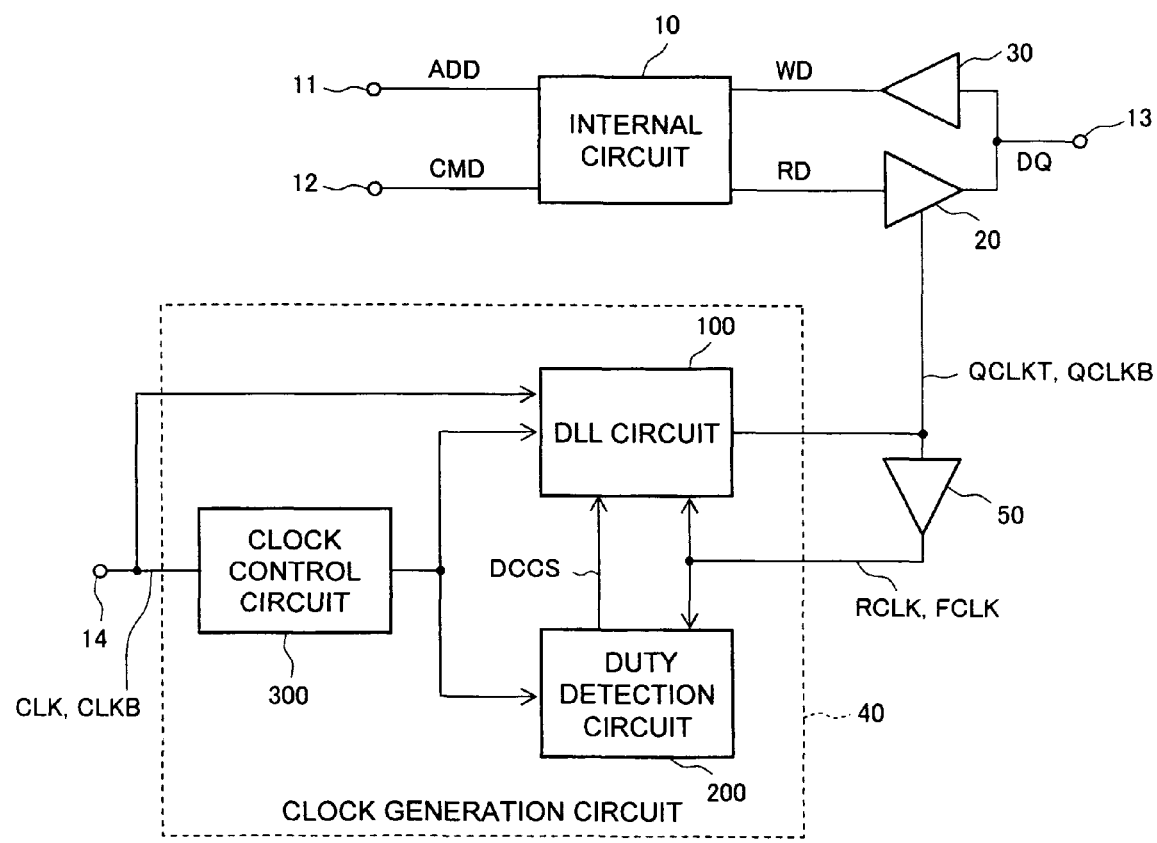
FIG. 1 is a block diagram showing a configuration of a semiconductor device according to an embodiment of the present invention.

FIG. 1 is a block diagram showing a configuration of a semiconductor device according to an embodiment of the present invention.

The semiconductor device according to the present invention is a DDR synchronous memory device although not limited thereto. The semiconductor device includes an internal circuit 10, an output buffer 20, an input buffer 30, a clock generation circuit 40, and a replica buffer 50.

The internal circuit 10 is a circuit block for realizing main functions of the semiconductor device. In the present embodiment, the internal circuit 10 includes a memory cell array, an address decoder, a command decoder, a data amplifier and the like. Therefore, the internal circuit 10 according to the present embodiment operates based on an address signal ADD and a command signal CMD supplied from an address terminal 11 and a command terminal 12, respectively. When the command signal CMD indicates a read operation, for example, output data RD from a memory cell designated by the address signal ADD is output from a data input/output terminal 13 via the output buffer 20. When the command signal CMD indicates a write operation, for example, input data WD input to the data input/output terminal 13 is supplied to the internal circuit 10 via the input buffer 30.

The clock generation circuit 40 controls operating timing of the output buffer 20. The clock generation circuit 40 is a circuit that generates internal clocks QCLKT and QCLKB based on external clocks CLK and CLKB input to a clock terminal 14, respectively. The internal clocks QCLKT and QCLKB are supplied to the output buffer 20, and the output buffer 20 performs an output operation for outputting the output data RD synchronously with the internal clocks QCLKT and QCLKB.

As shown in FIG. 1, the clock generation circuit 40 includes a DLL circuit 100 that generates the internal clocks QCLKT and QCLKB that are phase-controlled by delaying the external clocks CLK and CLKB, respectively, a duty detection circuit 200 that detects duty ratios of internal clocks RCLK and FCLK, and a clock control circuit 300 that generates operation clocks for the DLL circuit 100 and the duty detection circuit 200. The internal clocks QCLKT and QCLKB are signals having phases inverted with respect to each other. Likewise, the internal clocks RCLK and FOLK are signals having phases inverted with respect to each other. Details of the circuit blocks, that is, the DLL circuit 100, the duty detection circuit 200, and the clock control circuit 300, constituting the clock generation circuit 40 are described below.

Figure 2:
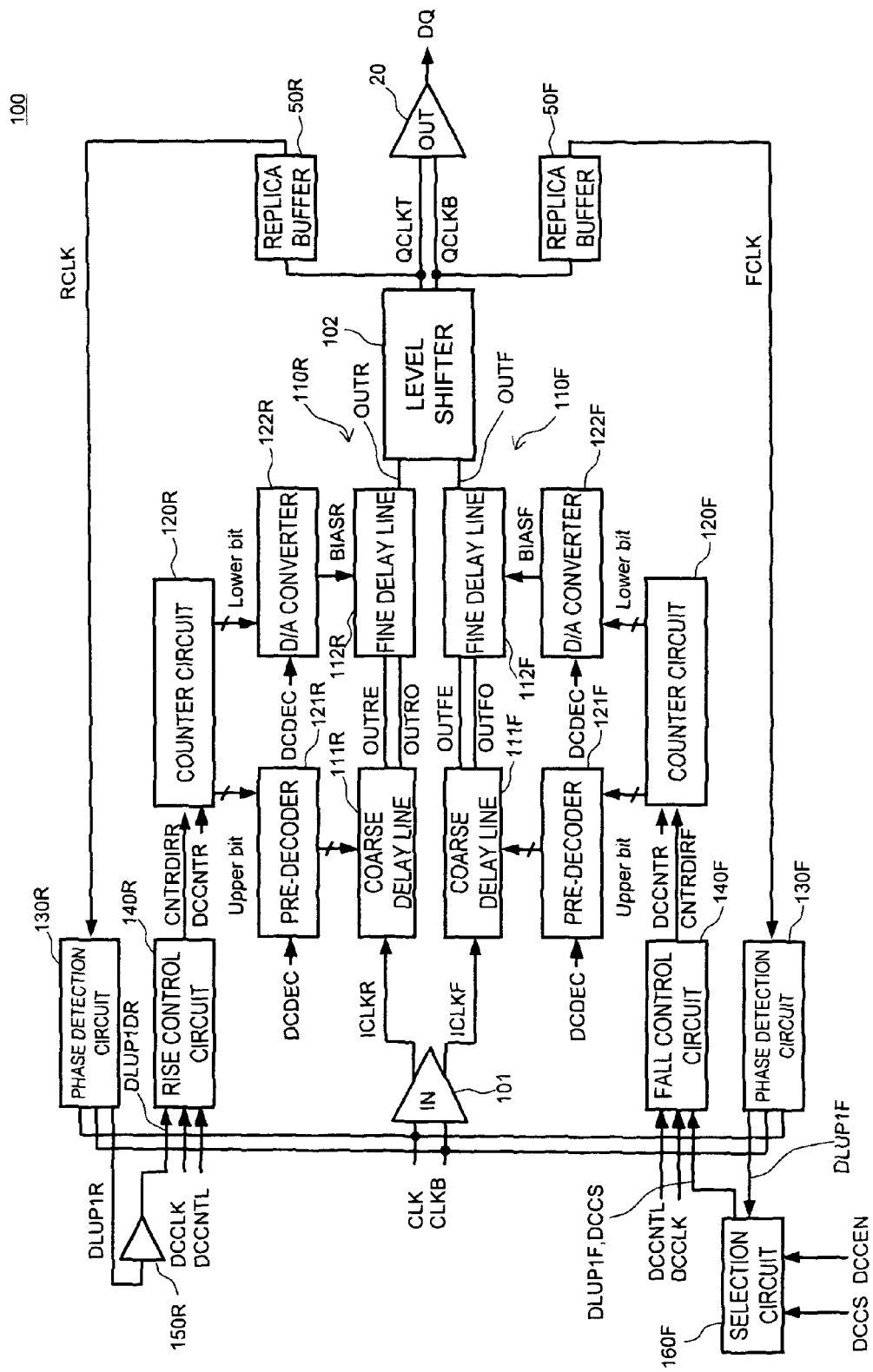
FIG. 2 is a block diagram showing a configuration of the DLL circuit 100.

FIG. 2 is a block diagram showing a configuration of the DLL circuit 100.

As shown in FIG. 2, the DLL circuit 100 includes a clock receiver 101 that receives the external clocks CLK and CLKB, a delay line 110R that delays an internal clock ICLKR that is one of outputs from the clock receiver 101, and a delay line 110F that delays an internal clock ICLKF that is the other output from the clock receiver 101. A level shifter 102 shifts levels of internal clocks OUTR and OUTF generated by the delay lines 110R and 110F and outputs the level-shifted internal clocks OUTR and OUTF as the internal clocks QCLKT and QCLKB described above, respectively.

The internal clock QCLKT is also output to a replica buffer 50R and an output from the replica buffer 50R is used as the internal clock RCLK. Likewise, the internal clock QCLKB is also output to a replica buffer 50F and an output from the replica buffer 50F is used as the internal clock FCLK. The replica buffers 50R and 50F are substantially identical to the output buffer 20 in circuit configuration. Accordingly, phases of the internal clocks RCLK and FCLK accurately coincide with output data DQ output from the data input/output terminal 13. However, sizes of transistors constituting the replica buffers 50R or 50F are not always the same as those of transistors constituting the output buffer 20. As long as the replica buffers 50R and 50F are substantially equal in impedance to the output buffer 20, shrinking transistors can be used as constituent elements of the replica buffers 50R and 50F.

The internal clock QCLKT is a signal having a rising edge synchronized with a rising edge of the external clock CLK (and a falling edge of the external clock CLKB). The internal clock QCLKB is basically a signal having a rising edge synchronized with a falling edge of the external clock CLK (and a rising edge of the external clock CLKB). However, when the duty detection circuit 200 is used, the internal clock QCLKB is defined as a signal that is obtained so that a duty ratio of each of the internal clocks QLCKT and QCLKB is 50% irrespectively of duty ratios of the external clocks CLK and CLKB. That is, the internal clock QCLKB is phase-controlled so as to generate an active edge of the internal clock QCLKB at timing of passage of exactly a ½ cycle from an active edge of the internal clock QCLKT.

As shown in FIG. 2, the delay line 110R is configured to include a coarse delay line 111R performing a coarse adjustment operation and a fine delay line 112R performing a fine adjustment operation. Likewise, the delay line 110F is configured to include a coarse delay line 111F performing a coarse adjustment operation and a fine delay line 112F performing a fine adjustment operation.

Each of the coarse delay lines 111R and 111F is a circuit in which a plurality of delay elements are cascaded and can obtain different delay amounts depending on an output from which delay element is fetched. Accordingly, an adjustment pitch of each of the coarse delay lines 111R and 111F is defined by a delay amount of one delay element. Outputs from the coarse delay line 111R are two internal clocks OUTRE and OUTRO, and a difference between delay amounts of the internal clocks OUTRE and OUTRO is equal to the adjustment pitch of the coarse delay line 111R. Likewise, outputs from the coarse delay line 111F are two internal clocks OUTFE and OUTFO, and a difference between delay amounts of the internal clocks OUTFE and OUTFO is equal to the adjustment pitch of the coarse delay line 111F.

Outputs from pre-decoders 121R and 121F define delay amounts of the coarse delay lines' 111R and 111F, respectively. The pre-decoders 121R and 121F are circuits that pre-decode upper bits of count values of counter circuits 120R and 120F, respectively, and output values of the pre-decoders 121R and 121F are updated synchronously with an operation clock DCDEC. In addition, the count values of the counter circuits 120R and 120F are updated synchronously with an operation clock DCCNTR. The operation clocks DCDEC and DCCNTR are signals supplied from the clock control circuit 300.

The fine delay lines 112R and 112F are interpolators that combine paired internal clocks OUTRE and OUTRO and OUTFE and OUTFO supplied from the coarse delay lines 111R and 111F, respectively. The fine delay lines 112R and 112F perform interpolation operations, thereby generating the internal clocks OUTR and OUTF having phases between those of the paired internal clocks, respectively. Bias voltages BIASR and BIASF output from D/A converters 122R and 122F define clock combining ratios of the fine delay lines 112R and 112F, respectively. The D/A converters 122R and 122F are circuits that generate the bias voltages BIASR and BIASF by converting lower bits of the count values of the counter circuits 120R and 120F into analog signals, respectively. The bias voltages BIASR and BIASF are updated synchronously with the operation clock DCDEC.

As shown in FIG. 2, the DLL circuit 100 also includes phase detection circuits 130R and 130F. The phase detection circuit 130R is a circuit that compares a phase of the internal clock RCLK output from the replica buffer 50R with phases of the external clocks CLK and CLKB, and that outputs a comparison result as a phase detection signal DLUP1R. Likewise, the phase detection circuit 130F is a circuit that compares a phase of the internal clock FOLK output from the replica buffer 50F with the phases of the external clocks CLK and CLKB, and that outputs a comparison result as a phase detection signal DLUP1F. The phase detection circuits 130R and 130F make phase comparisons to detect whether the internal clocks RCLK and FCLK advance or delay with respect to the external clocks CLK and CLKB. Accordingly, the phase detection signals DLUP1R and DLUP1F output from the phase detection circuits 130R and 130F, respectively are 1-bit signals at either high or low level.

The phase detection signal DLUP1R output from the phase detection circuit 130R is supplied to a rise control circuit 140R via a buffer 150R as it is. On the other hand, the phase detection signal DLUP1F output from the phase detection circuit 130F is supplied to a selection circuit 160F. The selection circuit 160F selects one of the phase detection signal DLUP1F output from the phase detection circuit 130F and a duty detection signal DCCS output from the duty detection circuit 200, and supplies the selected signal to a fall control circuit 140F. Selection made by the selection circuit 160F is based on a selection signal DCCEN.

Accordingly, when the selection circuit 160F selects the phase detection signal DLUP1F, the DLL circuit 100 turns into "phase control mode (DCC-OFF mode)" in which the active edge of the internal clock QCLKB is controlled based on the phase of the internal clock FCLK. When the selection circuit 160F selects the duty detection signal DCCS, the DLL circuit 100 turns into "duty control mode (DCC-ON mode)" in which the active edge of the internal clock QCLKB is controlled based on the duty ratios of the internal clocks RCLK and FCLK. In the phase control mode, the duty detection circuit 200 is not used.

The rise control circuit 140R receives the phase detection signal DLUP1R transmitted via the buffer 150R and operation clocks DCCLK and DCCNTL, and generates an up-down signal CNTRDIRR based on the received signals. The rise control circuit 140R supplies the generated up-down signal CNTRDIRR to the counter circuit 120R, and the counter circuit 120R counts up or counts down based on the up-down signal CNTRDIRR. Likewise, the fall control circuit 140F receives the phase detection signal DLUP1F or the duty detection signal DCCS and the operation clocks DCCLK and DCCNTL, and generates an up-down signal CNTRDIRF based on the received signals. The fall control circuit 140F supplies the generated up-down signal CNTRDIRF to the counter circuit 120F, and the counter circuit 120F counts up or counts down based on the up-down signal CNTRDIRF.

More specifically, the rise control circuit 140R latches the phase detection signal DLUP1DR synchronously with the operation clock DCCLK, and generates the up-down signal CNTRDIRR based on the latched phase detection signal DLUP1DR. The rise control circuit 140R continues an operation for latching the phase detection signal DLUP1DR until the operation clock DCCNTL is activated. As described later, a period until the operation clock DCCNTL is activated varies depending on whether the DLL circuit 100 is in a locked state. When the DLL circuit 100 is in an unlocked state, the operation clock DCCNTL is activated right after the rise control circuit 140R latches one phase detection signal DLUP1DR. When the DLL circuit 100 is in a locked state, the operation clock DCCNTL is activated after the rise control circuit 140R latches a plurality of (for example, five) phase detection signals DLUP1DR.

Accordingly, when the DLL circuit 100 is in an unlocked state, the rise control circuit 140R determines a logic level of the up-down signal CNTRDIRR by the phase detection signal DLUP1DR of 1 bit. When the DLL circuit 100 is in a locked state, the rise control circuit 140R determines the logic level of the up-down signal CNTRDIRR by the phase detection signals DLUP1DR of a plurality of bits. When the phase detection signals DLUP1DR of a plurality of bits are used, the rise control circuit 140R can determine the logic level of the up-down signal CNTRDIRR under any desired rule. For example, a method for determination by majority can be used.

The fall control circuit 140F operates similarly to the rise control circuit 140R described above. The rise control circuit 140R and the fall control circuit 140F are delay control circuits that control delay amounts of the delay lines 110R and 110F, respectively.

The configuration of the DLL circuit 100 is as described above. An operation performed by the DLL circuit 100 is described later. The duty detection circuit 200 is described next.

Figure 3:
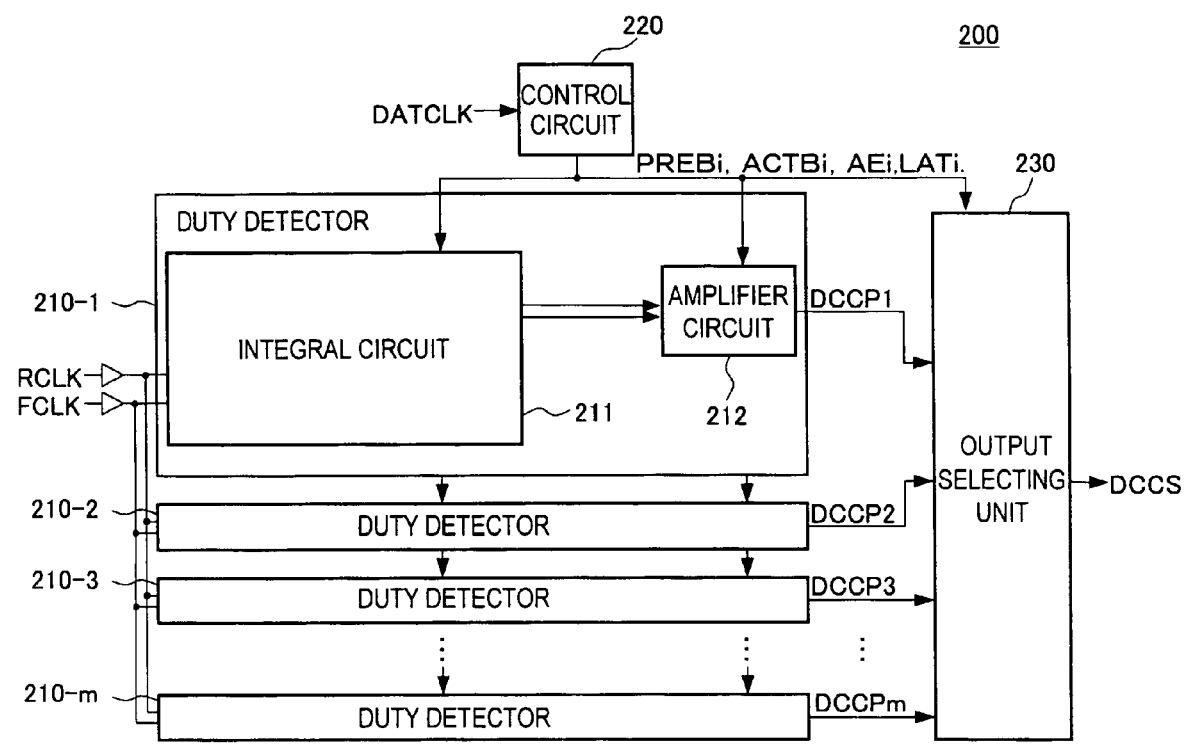
FIG. 3 is a block diagram showing a configuration of the duty detection circuit 200.

FIG. 3 is a block diagram showing a configuration of the duty detection circuit 200.

As shown in FIG. 3, the duty detection circuit 200 includes m (where m is an integer equal to or greater than 2) duty detectors 210-1 to 210-m that detect the duty ratios of the internal clocks RCLK and FCLK, a controller 220 that controls operations performed by these duty detectors 210-1 to 210-m, and an output selecting unit 230 selecting one of duty detection signals DCCP1 to DCCPm output from the duty detectors 210-1 to 210-m. The duty detectors 210-1 to 210-m are identical in circuit configuration, and the controller 220 controls the duty detectors 210-1 to 210-m so that the duty detectors 210-1 to 210-m operate indifferent phases from one another.

Figure 4:
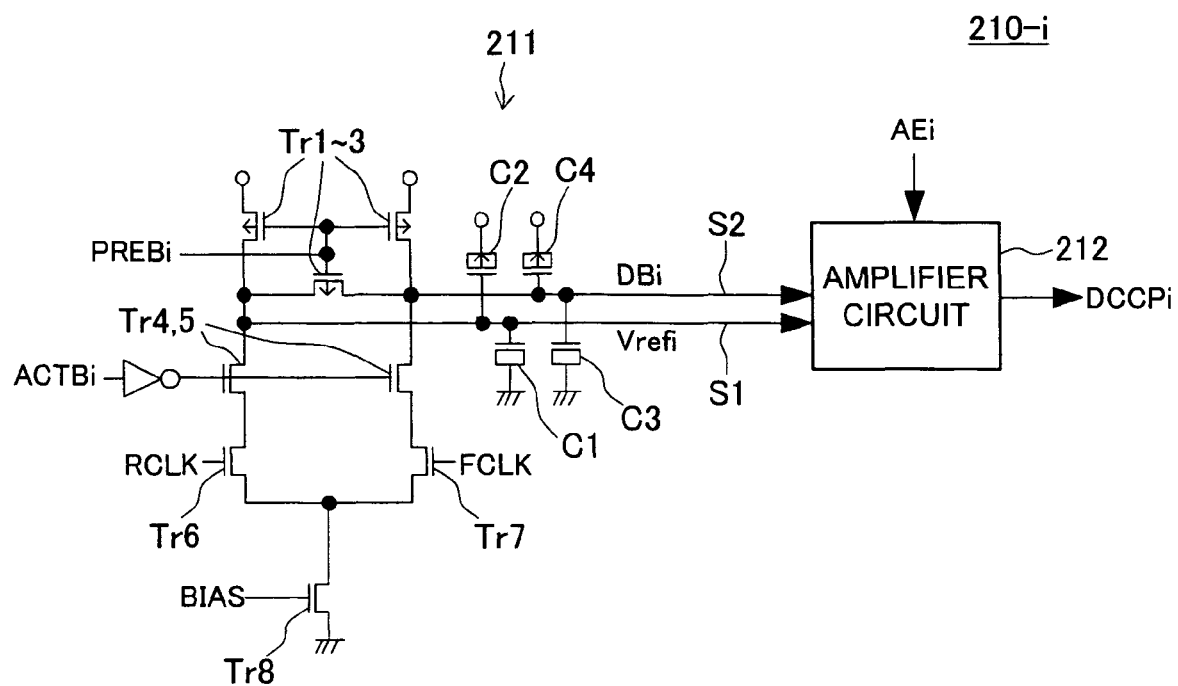
FIG. 4 is a circuit diagram of a duty detector 210-i (where i=1 to m)

FIG. 4 is a circuit diagram of a duty detector 210-i (where i=1 to m).

As shown in FIG. 4, the duty detector 210-i includes an integral circuit 211 that includes integral capacitors C1 to C4 into or from which electricity is charged or discharged synchronously with the internal clocks RCLK and FCLK, and an amplifier circuit 212 that generates a duty detection signal DCCPi based on charging voltages of the integral capacitors C1 to C4.

More specifically, the integral circuit 211 includes the integral capacitors C1 and C2 each having one end connected to a signal line S1, the integral capacitors C3 and C4 each having one end connected to a signal line S2, precharge transistors Tr1 to Tr3 precharging the integral capacitors C1 and C3, activation transistors Tr4 and Tr5 permitting discharging the integral capacitors C1 and C3, discharge transistors Tr6 and Tr7 switched in response to the internal clocks RCLK and FCLK, respectively, and a bias transistor Tr8 inserted between sources of the discharge transistors Tr6 and Tr7 and a ground potential VSS. The other end of each of the integral capacitors C1 and C3 is connected to the ground potential VSS, and the other end of each of the integral capacitors C2 and C4 is connected to a power supply potential VDD.

By so configuring the duty detector 210-i, when the precharge transistors Tr1 to Tr3 are turned on, then the integral capacitors C1 and C3 are charged with a voltage VDD-VSS, and the charging voltages of the integral capacitors C2 and C4 are zero. After precharging, when the internal clock RCLK is made high level in a state of turning on the activation transistors Tr4 and Tr5, then electricity is discharged from the integral capacitor C1 and electricity is charged into the integral capacitor C2. As a result, a potential of the signal line S1 gradually falls from a precharge level. Likewise, when the internal clock FCLK is made high level in the state of turning on the activation transistors Tr4 and Tr5, then electricity is discharged from the integral capacitor C3 and electricity is charged into the integral capacitor C4. As a result, a potential of the signal line S2 gradually falls from a precharge level. The control circuit 220 shown in FIG. 3 supplies a control signal PREBi that controls the precharge transistors Tr1 to Tr3 and a control signal ACTBi that controls the activation transistors Tr4 and Tr5 to the duty detector 210-i.

Through the operations described above, a potential difference between the signal lines S1 and S2 is determined based on high level periods, that is, the duty ratios of the internal clocks RCLK and FCLK. Specifically, when the internal clock RCLK is longer in the high level period than the internal clock FCLK, a relationship between a potential Vrefi of the signal line S1 and a potential DBi of the signal line S2 is DBi>Vrefi. Conversely, when the internal clock FCLK is longer in the high level period than the internal clock RCLK, the relationship between the potential Vrefi of the signal line S1 and the potential DBi of the signal line S2 is DBi<Vrefi.

The amplifier circuit 212 makes a comparison for the potential difference generated as described above, and amplifies the potential difference. Specifically, the amplifier circuit 212 sets the duty detection signal DCCPi to high level when the potential DBi of the signal line S2 is higher than a reference potential, that is, the potential Vrefi of the signal line S1. Conversely, the amplifier circuit 212 sets the duty detection signal DCCPi to low level when the potential DBi of the signal line S2 is lower than the potential Vrefi of the signal line S1. The controller 220 supplies a control signal AEi that controls an operation performed by the amplifier circuit 212 to the amplifier circuit 212.

Figure 5:
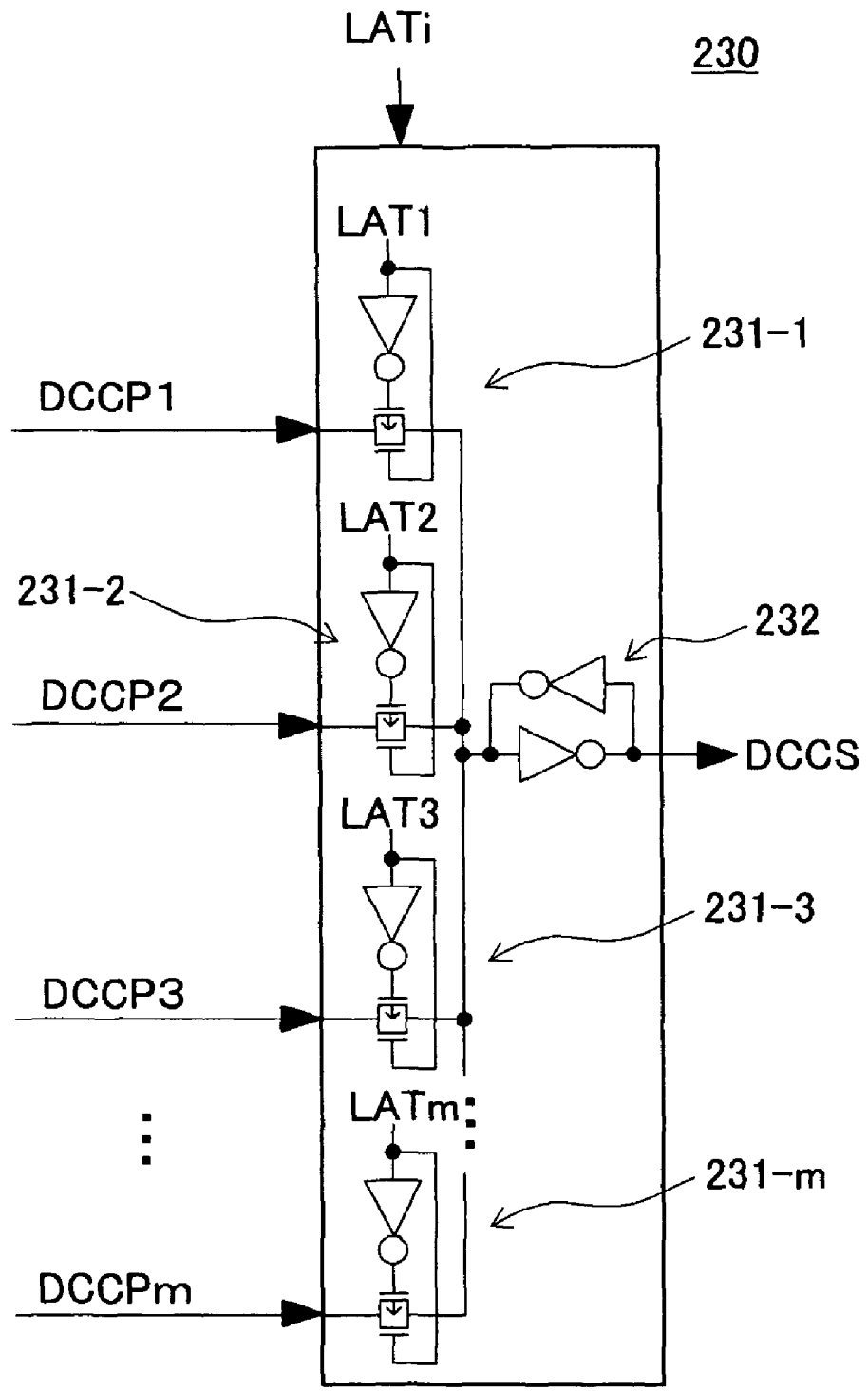
FIG. 5 is a circuit diagram of the output selecting unit 230.

FIG. 5 is a circuit diagram of the output selecting unit 230.

As shown in FIG. 5, the output selecting unit 230 includes selectors 231-1 to 231-m to which duty detection signals DCCP1 to DCCPm are input, and a latch circuit 232 latches duty selection signals having passing through the selectors 231-1 to 231-m, respectively.

The controller 220 supplies selection signals LAT1 to LATm (hereinafter, also "LATi" collectively) to the selectors 231-1 to 231-m, respectively, whereby only any one of the duty detection signals DCCP1 to DCCPm pass through the selectors 231-1 to 231-m, respectively. The latch circuit 232 latches the duty detection signals DCCP1 to DCCPm having passed through the selectors 231-1 to 231-m, and finally outputs the latched signals as the duty detection signal DCCS.

The circuit configuration of the duty detection circuit 200 is as described above. The controller 220 included in the duty detection circuit 200 generates the control signals PREBi, ACTBi, and AEi and the selection signals LATi so that the m duty detectors 210-1 to 210-m operate in the different phases from one another. Specifically, when it is assumed that it takes a predetermined time X for the output selecting unit 230 outputs the duty detection signal DCCS corresponding to the duty detector 210-i since the duty detector 210-i starts a duty detection operation, the controller 220 controls the different duty detectors 210-1 to 210-m so that the duty detectors 210-1 to 210-m start operating at X/m intervals.

The predetermined time X is preferably expressed by n times as large as the number of cycles of the internal clocks RCLK and FCLK (where n is an integer equal to or greater than 2), and it is more preferable that m is a divisor of n. When m is a divisor of n, the controller 220 can control the different duty detectors 210-1 to 210-m so that the duty detectors 210-1 to 210-m start operating at n/m cycles' intervals. In this case, when the output selecting unit 230 selects different duty detection signals DCCPi at the n/m cycles' intervals, it is possible to obtain latest duty detection signals DCCS at intervals of n/m cycles of the internal clocks RCLK and FCLK. The update frequency of updating the duty detection signal of the conventional duty detection circuit is n cycles. Therefore, it is clear that the duty detection circuit 200 according to the present embodiment can update the duty detection signal DCCS with a frequency m times as high as the update frequency of the conventional duty detection circuit.

For example, two cycles are necessary for charging or discharging operations for the integral capacitors C1 to C4, one cycle is necessary for voltage determination based on an operation performed by the amplifier circuit 212, and one cycle is necessary for the selection and a latch operation made or performed by the output selecting unit 230. In this case, since n=4, it is desirable that m that is the number of duty detectors 210-i is 4 or 2 that is a divisor of n and an integer equal to or greater than 2. In this case, when m=4, it suffices to control the different duty detectors 210-1 to 210-m so that the different duty detectors 210-1 to 210-m start operating at intervals of one cycle of the internal clocks RCLK and FCLK. When m=2, it suffices to control the different duty detectors 210-1 to 210-m so that the different duty detectors 210-1 to 210-m start operating at intervals of two cycles of the internal clocks RCLK and FCLK. However, in the present invention, it is not essential to set m as a divisor of n.

Figure 6:
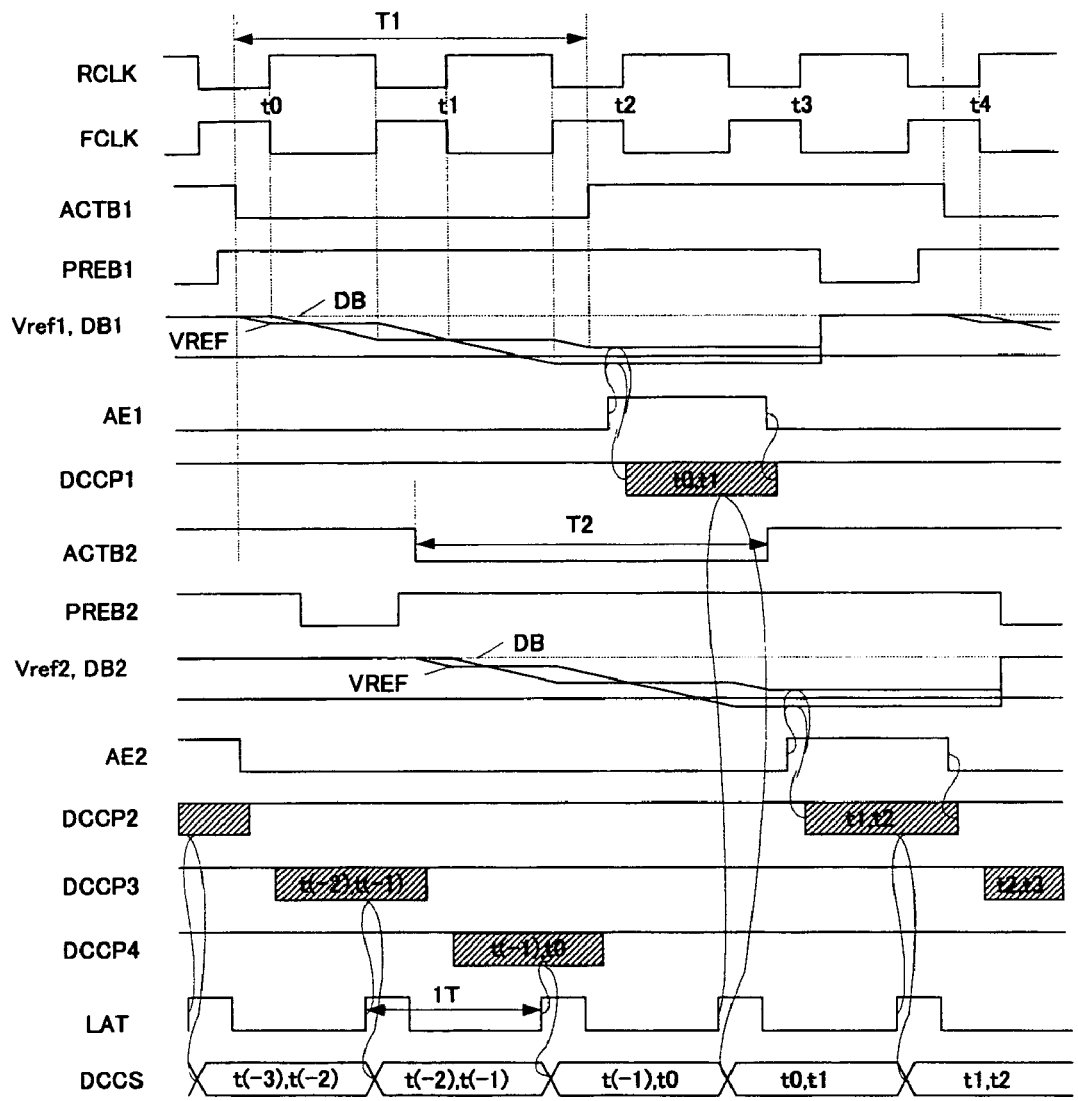
FIG. 6 is a timing chart showing an operation performed by the duty detection circuit 200.

FIG. 6 is a timing chart showing an operation performed by the duty detection circuit 200 when m=n=4.

In an example shown in FIG. 6, a control signal ACTB1 is activated in a period T1, and a control signal ACTB2 is activated in a period T2. The control signals ACTB1 and ACTB2 are signals for activating the duty detectors 210-1 and 210-2, respectively. Each of the periods T1 and T2 is a two-clock cycle and the period T2 has a phase delay of one clock with respect to the period T1. Although not shown in FIG. 6, the same is true for control signals ACTB3 and ACTB4.

In the period T1 in which the control signal ACTB1 is activated, charging or discharging of the integral capacitors C1 to C4 included in the duty detector 210-1 is performed, thereby converting the duty ratio of each of the internal clocks RCLK and FCLK into the potential difference between potentials Vref1 and DB1. In the example shown in FIG. 6, the internal clock RCLK has a longer high-level period than that of the internal clock FCLK. As a result, at end of the period T1, the relationship between the potentials Vref and DB is Vref>DB.

After the end of the period T1, a control signal AE1 is activated. The amplifier circuit 212 thereby detects and amplifies the potential difference between the signal lines S1 and S2, and a logic level of the duty detection signal DCCP1 is determined. The control signal AE1 is activated over about one-clock cycle.

The controller 220 controls the duty detectors 210-1 to 210-4 to perform such operations in parallel with one-clock delays, thereby generating latest duty detection signals DCCP1 to DCCP4 consecutively at one-clock intervals.

When the selection signals LAT1 to LAT4 are consecutively activated while control signals AE1 to AE4 are activated, the duty detection signals DCCP1 to DCCP4 pass through the selectors 231-1 to 231-4, respectively, and are consecutively latched by the latch circuit 232. Accordingly, a value of the duty detection signal DCCS is updated per clock.

The configuration and operations of the duty detection circuit 200 are as described above. The clock control circuit 300 is described next.

Figure 7:
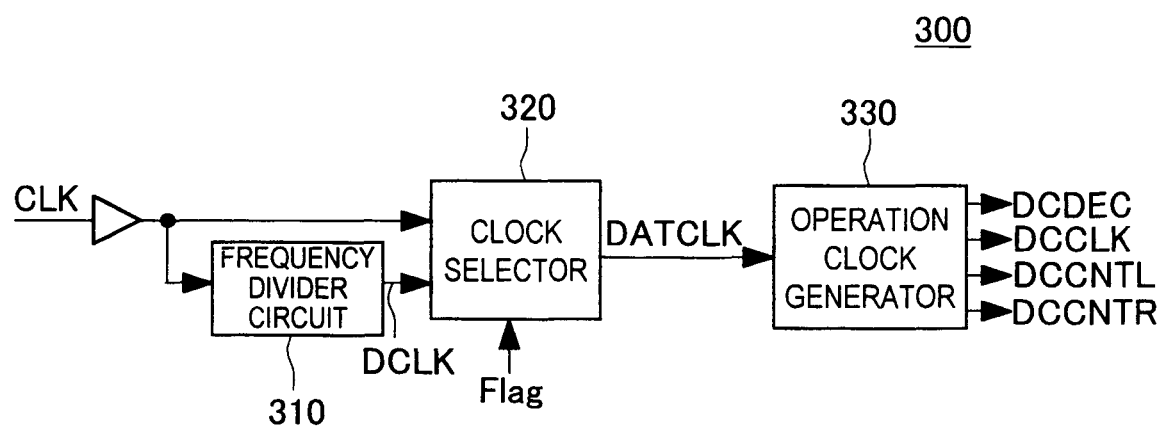
FIG. 7 is a block diagram showing a configuration of the clock control circuit 300.

FIG. 7 is a block diagram showing a configuration of the clock control circuit 300.

As shown in FIG. 7, the clock control circuit 300 includes a frequency divider circuit 310 that generates a frequency-divided clock DCLK by dividing a frequency of the external clock CLK, a clock selector 320 that selects one of the external clock CLK and the frequency-divided clock DCLK, and an operation clock generator 330 that generates the various operation clocks DCDEC, DCCLK, DCCNTL, and DCCNTR based on a selection clock DATCLK output from the clock selector 320.

A lock flag Flag indicating whether the DLL circuit 100 is in a locked state is input to the clock selector 320. The clock selector 320 selects one of the external clock CLK and the frequency-divided clock DCLK based on the lock flag Flag. Specifically, when the lock flag Flag indicates that the DLL circuit 100 is in an unlocked state, the clock selector 320 selects the external clock CLK. When the lock flag Flag indicates that the DLL circuit 100 is in a locked state, the clock selector 320 selects the frequency-divided clock DCLK. That is, when the DLL circuit 100 is in an unlocked state, a frequency of the selection clock DATCLK is relatively high. When the DLL circuit 100 is in a locked state, the frequency of the selection clock DATCLK is relatively low.

The divided clock DCLK generated by the frequency divider circuit 310 has a frequency of ½ of that of the external clock CLK, for example.

When the frequency of the selection clock DATCLK changes, those of the operation clocks DCDEC, DCCLK, DCCNTL, and DCCNTR output from the operation clock generator 330 change accordingly. Therefore, when the DLL circuit 100 is in an unlocked state, the frequencies of the operation clocks DCDEC, DCCLK, DCCNTL, and DCCNTR are relatively high. When the DLL circuit 100 is in a locked state, the frequencies of the operation clocks DCDEC, DCCLK, DCCNTL, and DCCNTR are relatively low. Further, as shown in FIG. 3, the selection clock DATCLK is also supplied to the controller 220 included in the duty detection circuit 200.

The reason for making such frequency switching is that it is necessary to promptly change the state of the DLL circuit 100 to a locked state when the DLL circuit 100 is in an unlocked state and it is necessary to maintain the locked state while suppressing power consumption when the DLL circuit 100 is in the locked state.

The configurations of the DLL circuit 100, the duty detection circuit 200, and the clock control circuit 300 constituting the clock generation circuit 40 are as described above. Operations performed by a semiconductor device according to the present embodiment are described next, while mainly referring to an operation performed by the clock generation circuit 40.

As described above, the DLL circuit 100 according to the present embodiment has the "phase control mode" in which the duty detection circuit 200 is not used and the "duty control mode" in which the duty detection circuit 200 is used. On the other hand, depending on whether the lock flag Flag indicates an unlocked state or a locked state of the DLL circuit 100, the clock control circuit 300 performs different operations. Accordingly, the operation is described in the following four aspects in sequence.

1. "Phase control mode" and "DLL circuit 100 is in an unlocked state"
2. "Phase control mode" and "DLL circuit 100 is in a locked state"
3. "Duty control mode" and "DLL circuit 100. is in an unlocked state"
4. "Duty control mode" and "DLL circuit 100 is in a locked state"

Figure 8:
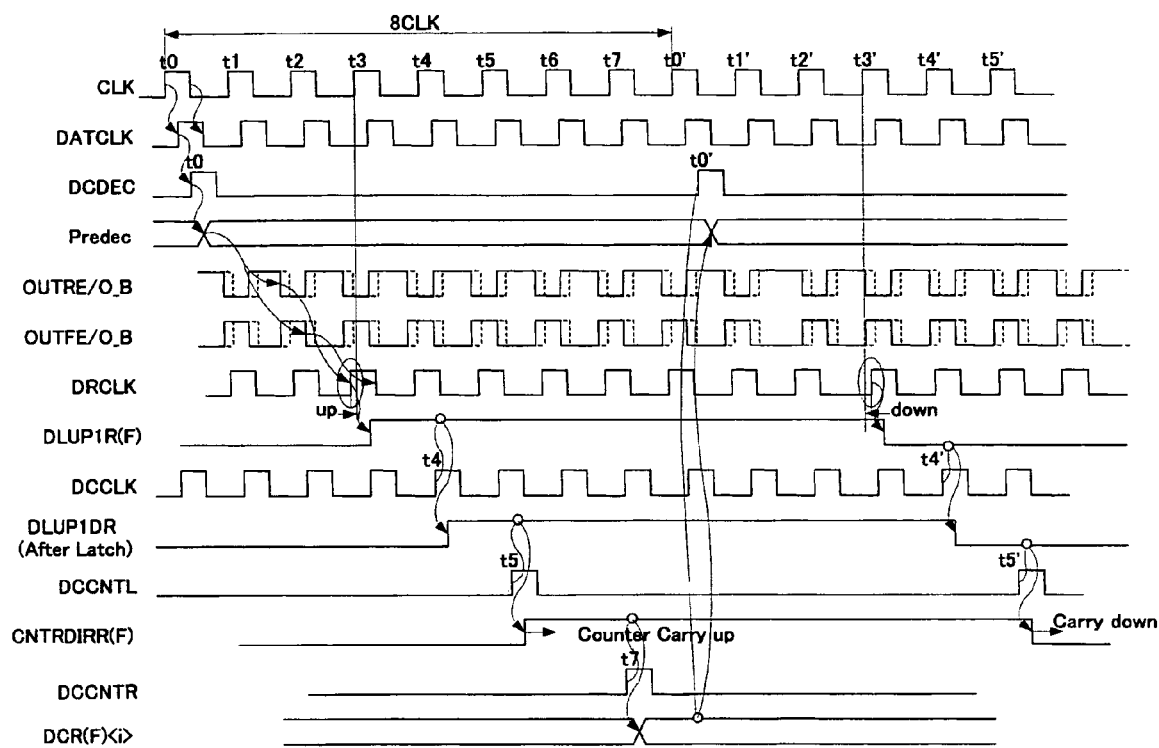
FIG. 8 is a timing diagram for explaining an operation when the mode of the DLL circuit 100 is the "phase control mode" and "DLL circuit 100 is in an unlocked state"

FIG. 8 is a timing diagram for explaining an operation when the mode of the DLL circuit 100 is the "phase control mode" and "DLL circuit 100 is in an unlocked state".

As described above, when the DLL circuit 100 is in an unlocked state, the clock selector 320 selects the external clock CLK. Therefore, as shown in FIG. 8, the frequency of the selection clock DATCLK is equal to that of the external clock CLK. In this example, the operation clock generator 330 activates the operation clocks DCDEC, DCCLK, DCCNTL, and DCCNTR at intervals of eight cycles of the selection clock DATCLK. In an example shown in FIG. 8, the operation clock DCDEC is activated synchronously with an active edge of the selection clock DATCLK at a time t0, the operation clock DCCNTL is activated synchronously with an active edge thereof at a time t5, and the operation clock DCCNTR is activated synchronously with an active edge thereof at a time t7. This sequence is repeated at intervals of eight cycles of the external clock CLK.

The operation clock DCDEC is a timing signal for updating output values from the pre-decoders 121R and 121F and the D/A converters 122R and 122F. When the operation clock DCDEC is activated, delay amounts of the delay lines 110R and 110F change. That is, in response to the active edge at the time t0, phases of the internal clocks QCLKT and QCLKB change. However, it needs a certain amount of time for changes of the phase of the internal clocks QCLKT and QCLKB to be reflected in determination results of the phase detection circuits 130R and 130F. In the example shown in FIG. 8, the changes are reflected in the determination results near an active edge of at a time t3, whereby the phase detection signal DLUP1R changes. Although not shown in FIG. 8, the same is true for the phase detection signal DLUP1F.

Considering such a reflection time, the rise control circuit 140R latches the phase detection signal DLUP1R synchronously with an active edge of the operation clock DCCLK at a time t4. The same is true for the fall control circuit 140F.

The operation clock DCCNTL is then activated synchronously with the active edge at the time t5. The rise control circuit 140R and the fall control circuit 140F thereby generate the up-down signals CNTRDIRR and CNTRDIRF based on latched contents, respectively. The operation clock DCCNTR is activated synchronously with the active edge at the time t7, thereby updating the count values of the counter circuits 120R and 120F.

In this way, when the DLL circuit 100 is in an unlocked state, the control period of the DLL circuit 100 is eight cycles and the DLL circuit 100 is controlled with high frequency. Therefore, the DLL circuit 100 can be promptly changed to a locked state.

Figure 9:
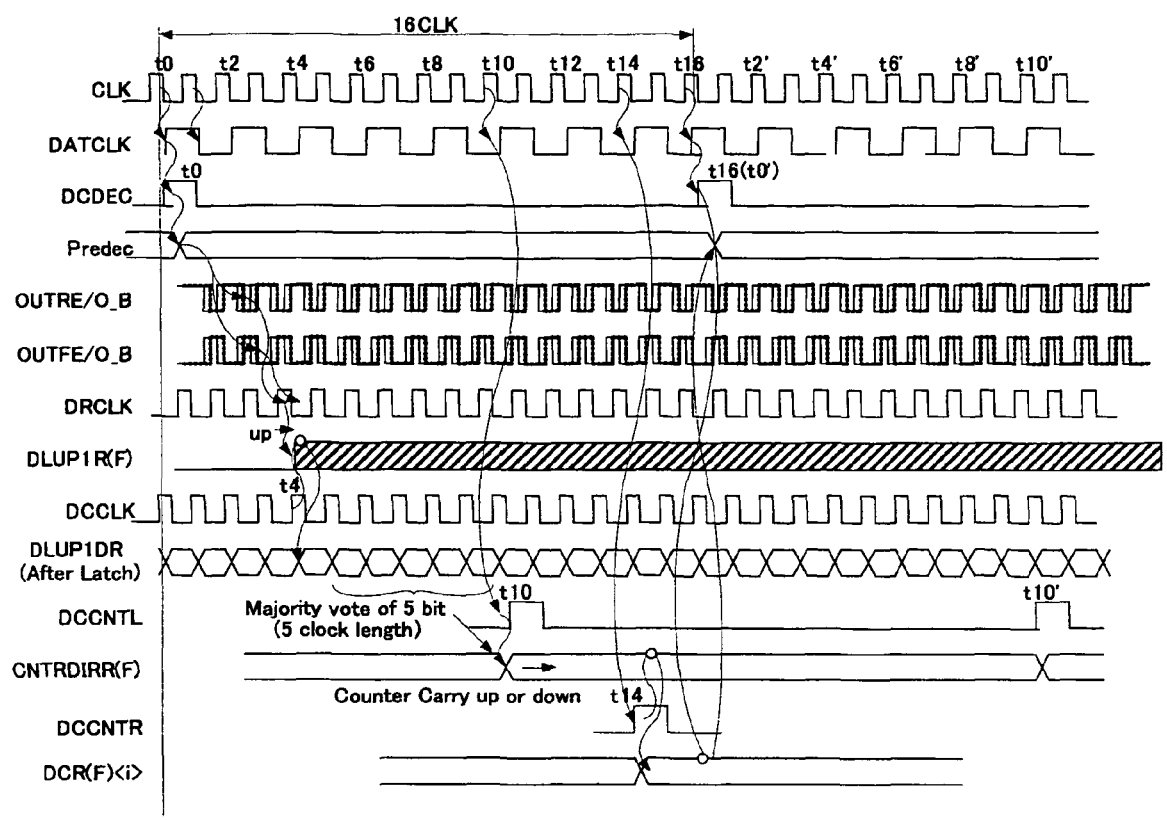
FIG. 9 is a timing diagram for explaining an operation when the mode of the DLL circuit 100 is the "phase control mode" and "DLL circuit 100 is in a locked state"

FIG. 9 is a timing diagram for explaining an operation when the mode of the DLL circuit 100 is the "phase control mode" and "DLL circuit 100 is in a locked state".

As described above, when the DLL circuit 100 is in a locked state, the clock selector 320 selects the frequency-divided clock DCLK. Therefore, as shown in FIG. 9, the frequency of the selection clock DATCLK is half the frequency of the external clock CLK. However, an operation sequence of the lock generator 330 is exactly the same as that shown in FIG. 8 and there is no need to change operations depending whether the DLL circuit 100 is locked.

In an example shown in FIG. 9, the frequency of the selection clock DATCLK is half the frequency of the external clock CLK. Therefore, the operation clock DCDEC is activated synchronously with an active edge at a time t0, the operation clock DCCNTL is activated synchronously with an active edge thereof at a time t10, and the operation clock DCCNTR is activated synchronously with an active edge at a time t14. This sequence is repeated at intervals of 16 cycles of the external clock CLK.

When the DLL circuit 100 is in a locked state, the rise control circuit 140R and the fall control circuit 140F can acquire a plurality of phase detection signals DLUP1R and DLUP1F during a period from the time t3 when changes of the delay amount of the delay lines 110R and 110F are reflected in the determination results of the phase detection circuits 130R and 130F, respectively until the time t10 when the operation clock DCCNTL is activated. In the example shown in FIG. 9, the rise control circuit 140R and the fall control circuit 140F acquire the phase detection signals DLUP1R and DLUP1F by as much as five clocks, and generate the up-down signals CNTRDIRR and CNTRDIRF by majority vote, respectively.

In this way, when the DLL circuit 100 is in a locked state, the control period of the DLL circuit 100 increases to 16 cycles. It is, therefore, possible to suppress power consumption. Besides, the rise control circuit 140R and the fall control circuit 140F generate the up-down signals CNTRDIRR and CNTRDIRF based on the phase detection signals DLUP1R and DLUP1F acquired a plurality of times. It is, therefore, possible to lessen influence of aliasing caused by jitter.

Figure 10:
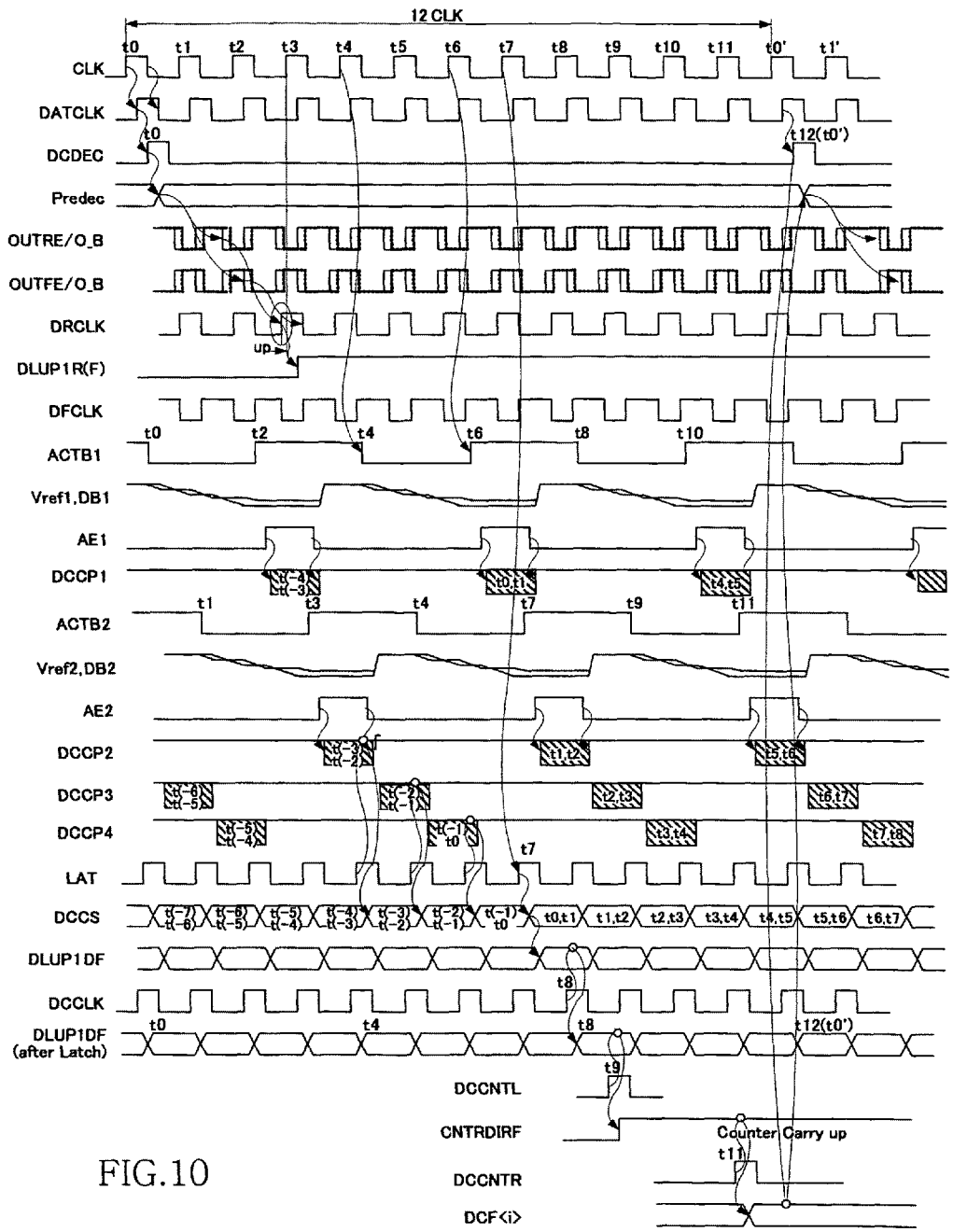
FIG. 10 is a timing diagram for explaining an operation when the mode of the DLL circuit 100 is the "duty control mode" and "DLL circuit 100 is in an unlocked state"

FIG. 10 is a timing diagram for explaining an operation when the mode of the DLL circuit 100 is the "duty control mode" and "DLL circuit 100 is in an unlocked state".

As described above, in the duty control mode, the duty detection circuit 200 is used. In this case, the operation clock generator 330 activates the operation clocks DCDEC, DCCLK, DCCNTL, and DCCNTR at intervals of 12 cycles of the selection clock DATCLK. In an example shown in FIG. 10, the operation clock DCDEC is activated synchronously with an active edge at the time t0, the operation clock DCCNTL is activated synchronously with an active edge at a time t9, and the operation clock DCCNTR is activated synchronously with an active edge at a time t11. This sequence is repeated at intervals of 12 cycles of the external clock CLK.

An operation performed by the rise control circuit 140R in the duty control mode is similar to that in the phase control mode. On the other hand, in the duty control mode, the fall control circuit 140F uses the duty detection signal DCCS output from the duty detection circuit 200.

In the example shown in FIG. 10, the duty detection signal DCCS output synchronously with an active edge at the time t7 is loaded to the fall control circuit 140F. Thereafter, the operation clock DCCNTL is activated synchronously with the active edge at the time t9 and the operation clock DCCNTR is activated synchronously with the active edge at the time t11. The count values of the counter circuits 120R and 120F are thereby updated.

In this way, when the DLL circuit 100 is in an unlocked state in the duty control mode, the control period of the DLL circuit 100 extends to 12 cycles. However, in the present embodiment, by setting n=m, the duty detection signal DCCS can be acquired synchronously with all active edges. Therefore, even when the frequency of the external clock CLK is higher, this does not greatly extend the control period of the DLL circuit 100.

Figure 11:
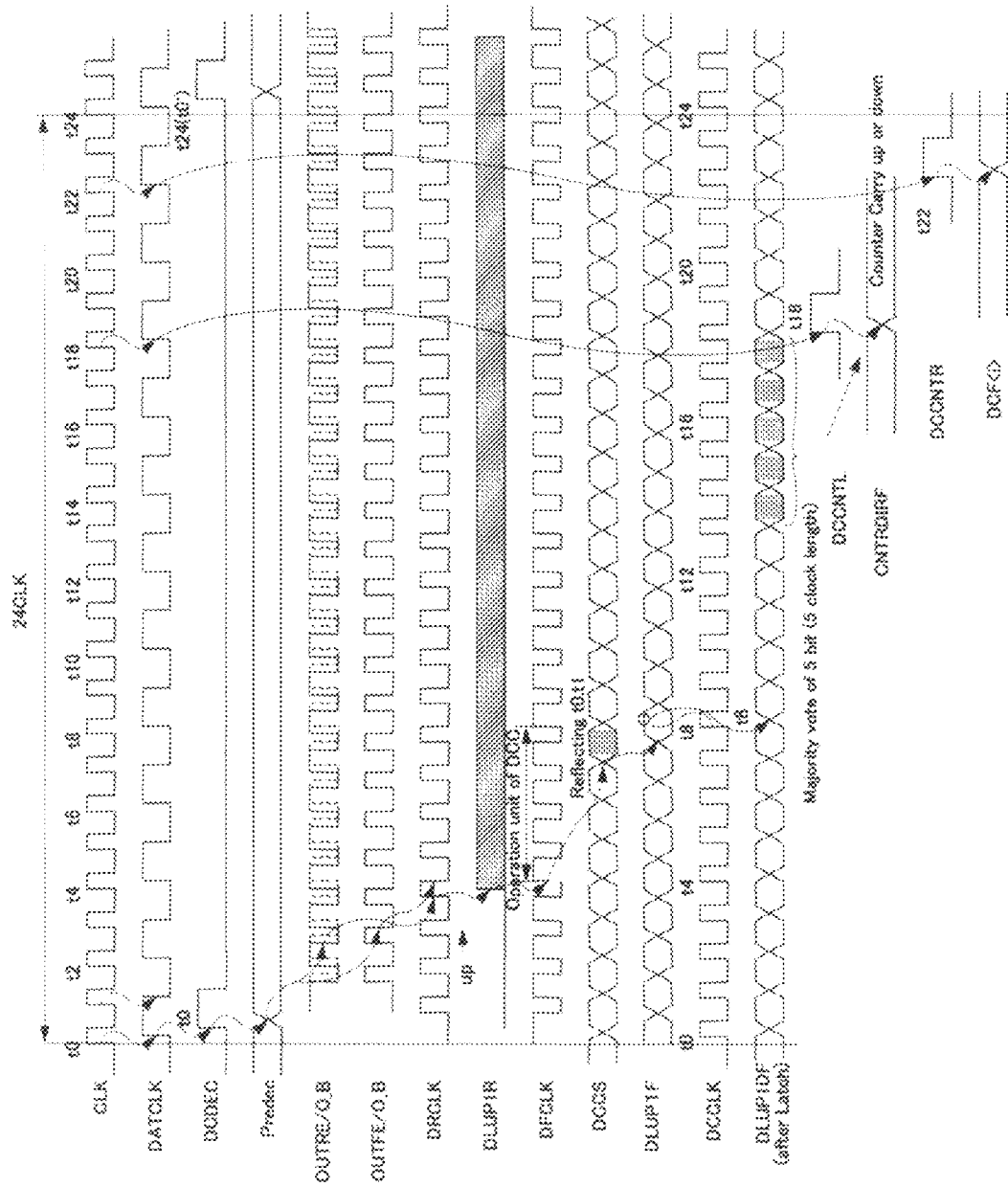
FIG. 11 is a timing diagram for explaining an operation when the mode of the DLL circuit 100 is the "duty control mode" and "DLL circuit 100 is in a locked state"

FIG. 11 is a timing diagram for explaining an operation when the mode of the DLL circuit 100 is the "duty control mode" and "DLL circuit 100 is in a locked state".

As described above, the frequency of the selection clock DATCLK is half the frequency of the external clock CLK. However, the operation sequence of the operation clock generator 330 is exactly the same as that shown in FIG. 10 and there is no need to change operations depending whether the DLL circuit 100 is locked.

In an example shown in FIG. 11, the operation clock DCDEC is activated synchronously with an active edge at the time t0, the operation clock DCCNTL is activated synchronously with an active edge at a time t18, and the operation clock DCCNTR is activated synchronously with an active edge at a time t22. This sequence is repeated at intervals of 24 cycles of the external clock CLK.

When the DLL circuit 100 is in an locked state, the fall control circuit 140F can acquire a plurality of duty detection signals DCCS during a period from a time t8 when the change of the delay amount of the delay line 110F is reflected in the output from the duty detection circuit 200 until the time t18 when the operation clock DCCNTL is activated. In the example shown in FIG. 11, the fall control circuit 140F acquires the duty detection signals DCCS by as much as five clocks, and generate the up-down signal CNTRDIRF by majority.

In this way, according to the present embodiment, it is possible to acquire a plurality of latest duty detection signals DCCS within a limited control period. Therefore, even in the duty control mode, it is possible to generate the up-down signal CNTRDIRF by majority. Therefore, the duty ratios of the internal clocks QCLKT and QCLKB can be accurately controlled to 50% without extending the control period.

Figure 12:
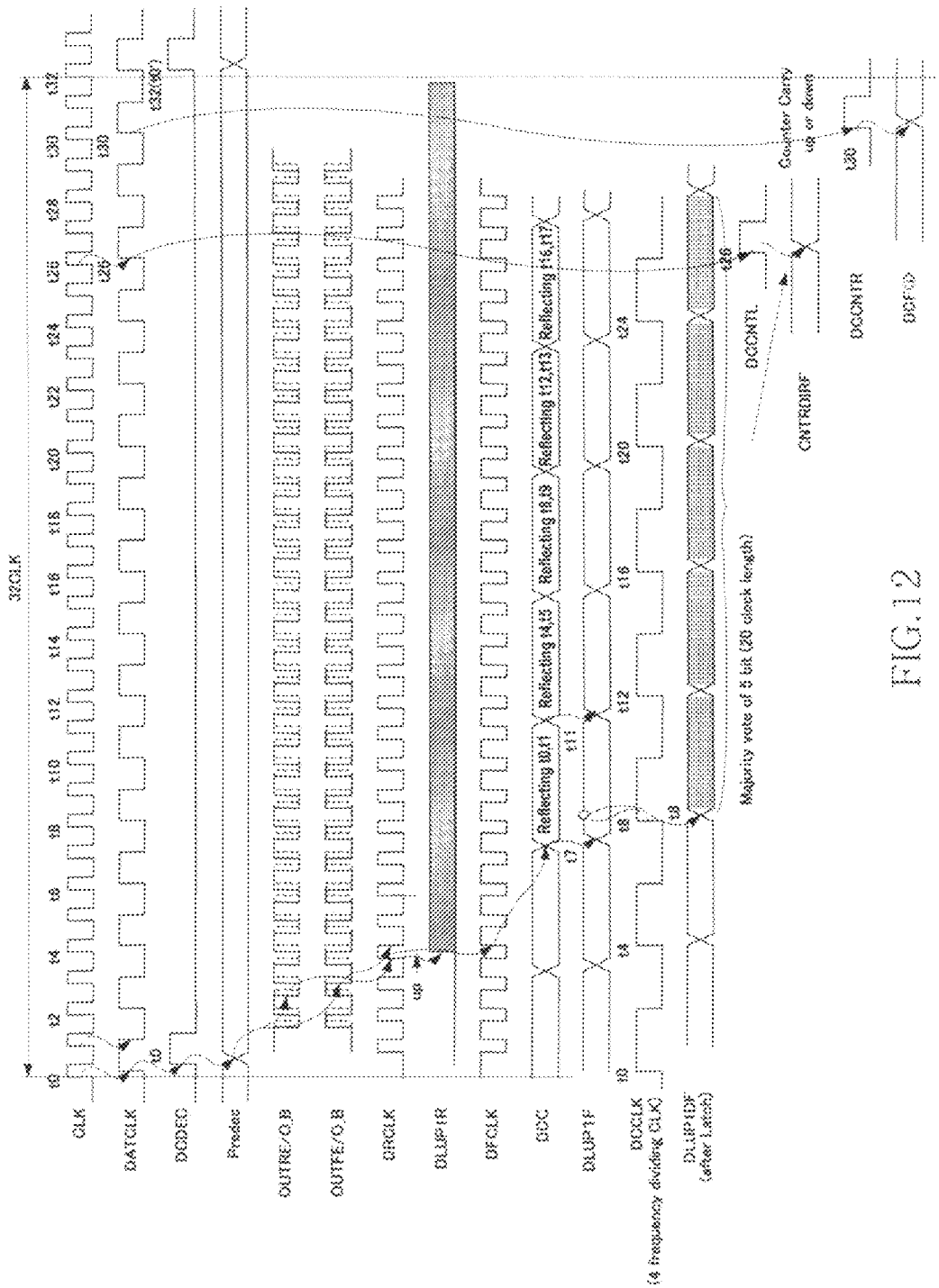
FIG. 12 is a timing diagram according to a comparative example.

FIG. 12 is a timing diagram for explaining an operation performed by a conventional duty detection circuit when the mode of the DLL circuit is the "duty control mode" and "DLL circuit is in a locked state" according to a comparative example.

As shown in FIG. 12, in the conventional duty detection circuit, an update frequency of the duty detection signal is low and, in an example shown in FIG. 12, the update frequency is four cycles. Therefore, when the up-down signal CNTRDIRF is generated by determination by majority of five duty detection signals DCC, it requires 20 cycles (=4×5 cycles) to perform such processing. This increases the control period of the DCC circuit to 32 cycles, and this results in not only deterioration of following characteristics of the internal clocks QCLKT and QCLKB but also need to switch activation timings of the operation clocks DCDEC, DCCLK, DCCNTL, and DCCNTR. That is, it is necessary to configure the operation clock generator to operate according to different sequences depending on whether the DLL circuit is in a locked state, thereby disadvantageously making the circuits complex.

On the other hand, according to the embodiment of the present invention described above, such problems do not occur, and the internal clocks QCLKT and QCLKB can be generated with high quality.

It is apparent that the present invention is not limited to the above embodiments, but may be modified and changed without departing from the scope and spirit of the invention.

What is claimed is:

1. A semiconductor device comprising:
   a plurality of duty detectors that detect duty ratios of an internal clock to generate duty detection signals, respectively;
   a control circuit that controls the duty detectors so that the duty detectors operate in different phases from one another; and
   an output selecting unit that selects one of the duty detection signals.

2. The semiconductor device as claimed in claim 1, wherein
   each of the duty detectors takes n cycles of the internal clock since starting a duty detection operation until the output selecting unit outputs an associated duty detection signal, where n is an integer equal to or greater than 2,
   number of the duty detectors is m, where m is an integer equal to or greater than 2, and
   the m is a divisor of the n.

3. The semiconductor device as claimed in claim 2, wherein the control circuit controls the duty detectors so that different duty detectors start duty detection operations at intervals of n/m cycles of the internal clock.

4. The semiconductor device as claimed in claim 2, wherein the output selecting unit selects different duty detection signals out of the duty detection signals at intervals of n/m cycles of the internal clock.

5. The semiconductor device as claimed in claim 1, wherein the output selecting unit includes:
   a selector that passes one of the duty detection signals; and
   a latch circuit that latches the duty detection signal having passed through the selector.

6. The semiconductor device as claimed in claim 1, wherein each of the duty detectors includes:
   an integral capacitor charged or discharged in response to the internal clock; and
   an amplifier circuit that amplifies a potential difference between a charging voltage of the integral capacitor and a reference voltage to generate the duty detection signal.

7. The semiconductor device as claimed in claim 1, further comprising:
   a DLL circuit that controls a phase of the internal clock; and
   first and second replica buffers, wherein
   the internal clock includes first and second internal clocks different in phase,
   the DLL circuit includes:
   a first delay line that generates a third internal clock by delaying a first external clock;
   a second delay line that generates a fourth internal clock by delaying a second external clock;
   a first phase comparison circuit that determines a phase difference between the first external clock and the first internal clock;
   a first delay control circuit that controls a delay amount of the first delay line based on a determination result of the first phase comparison circuit; and
   a second delay control circuit that controls a delay amount of the second delay line based on the duty detection signal, and wherein
   the first replica buffer generates the first internal clock in response to the third internal clock, and
   the second replica buffer generates the second internal clock in response to the fourth internal clock.

8. The semiconductor device as claimed in claim 7, wherein
   the DLL circuit further includes a second phase comparison circuit that determines a phase difference between the second external clock and the second internal clock, and
   the second delay control circuit includes:
   a first mode of controlling the delay amount of the second delay line based on a determination result of the second phase comparison circuit; and
   a second mode of controlling the delay amount of the second delay line based on the duty detection signal.

9. The semiconductor device as claimed in claim 7, further comprising a clock control circuit that generates an operation clock for the duty detection circuit and the DLL circuit, wherein
   the clock control circuit sets a frequency of the operation clock relatively high when the DLL circuit is in an unlocked state, and sets the frequency of the operation clock relatively low when the DLL circuit is in a locked state.

10. The semiconductor device as claimed in claim 9, wherein the first delay control circuit loads a determination result of the first phase comparison circuit a plurality of times in response to the operation clock, and controls the delay amount of the first delay line based on a plurality of the determination results.

11. The semiconductor device as claimed in claim 9, wherein the second delay control circuit loads the duty detection signal a plurality of times in response to the operation clock, and controls the delay amount of the second delay line based on a plurality of the duty detection signals.

12. The semiconductor device as claimed in claim 7, further comprising:
   an internal circuit that generates output data; and
   an output buffer that outputs the output data to outside in response to the third and fourth internal clocks, wherein the first and second replica buffers each have an impedance substantially equal to an impedance of the output buffer.

13. A device comprising:
a first terminal receiving an external clock signal;
a clock generating circuit coupled to the first terminal, including first and second circuit units, the first circuit unit generating an internal clock signal in response to the external clock signal, the second circuit unit including a plurality of detection portions detecting a plurality of duty ratios of the internal clock signal respectively during a plurality of first time periods different in timing starting and terminating from each other and output a plurality of duty detection signals, and the first circuit unit receiving one of the duty detection signals and adjusting a duty ratio of the internal clock signal in response to the one of the duty detection signals.

14. The device as claimed in claim 13, wherein the detection potions of the second circuit unit output the detection signals at timings different from each other.

15. The device as clamed in claim 13, wherein one of the first time periods overlaps partly with another one of the first time periods.

16. The device as claimed in claim 13, wherein the first time periods are equal in length of time to each other.

17. The device as claimed in claim 13, wherein the clock generating circuit includes a control circuit supplying the detection portions correspondingly with a plurality of first control signals in response to the external clock signal, the first control signals being activated at timings different from each other and deactivated at timings different from each other, and each of the detection portions starts detecting corresponding one of the duty ratios in response to an activation of corresponding one of the first control signals and terminates detecting the corresponding one of the duty ratios in response to an inactivation of the corresponding one of the first control signals.

18. The device as claimed in claim 13, wherein each of the detection portions detects a second time period in which the internal clock signal takes a first logic level during a corresponding one of the first time periods, detects a third time period in which the internal clock signal takes a second logic level different from the first logic level during the corresponding one of the first time periods, and compares the second time period and the third time period so as to generate one of the duty detection signals.

19. The device as claimed in claim 13, wherein each of the detection portions includes a first capacitor discharged during a second time period in which the internal clock signal takes a first logic level, a second capacitor discharged during a third time period in which the internal clock signal takes a second logic level different from the first logic level, and an amplifier circuit amplifying a potential difference between the first capacitor and the second capacitor so as to generate a corresponding one of the duty detection signals.

20. The device as claimed in claim 13, wherein the clock generating circuit includes an output unit receiving the duty detection signals, selecting one of the duty detection signals and supplying a selected one of the duty detection signals to the first circuit unit.

* * * * *